(12) United States Patent
Münzer

(10) Patent No.: US 7,217,883 B2
(45) Date of Patent: May 15, 2007

(54) MANUFACTURING A SOLAR CELL WITH BACKSIDE CONTACTS

(75) Inventor: Adolf Münzer, Lohhof (DE)

(73) Assignee: Shell Solar GmbH (DE)

( * ) Notice: Subject to any disclaimer, the term of this patent is extended or adjusted under 35 U.S.C. 154(b) by 0 days.

(21) Appl. No.: 10/496,371

(22) PCT Filed: Nov. 26, 2002

(86) PCT No.: PCT/EP02/13317

§ 371 (c)(1),
(2), (4) Date: May 24, 2004

(87) PCT Pub. No.: WO03/047005

PCT Pub. Date: Jun. 5, 2003

(65) Prior Publication Data

US 2005/0016585 A1   Jan. 27, 2005

(30) Foreign Application Priority Data

Nov. 26, 2001   (DE) ................... 101 57 960

(51) Int. Cl.
*H01L 31/248* (2006.01)
*H01L 31/18* (2006.01)

(52) U.S. Cl. ............... 136/256; 136/255; 136/244; 136/261; 257/465; 257/466; 257/461; 257/459; 257/436; 257/437; 438/98; 438/71; 438/72; 438/81; 438/83; 216/24; 216/17; 216/18

(58) Field of Classification Search ............... 136/256, 136/255, 244, 261; 257/465, 466, 461, 459, 257/436, 437; 438/98, 71, 72, 81, 83; 216/24, 216/17, 18

See application file for complete search history.

(56) References Cited

U.S. PATENT DOCUMENTS

| | | | |
|---|---|---|---|
| 4,255,212 A * | 3/1981 | Chappell et al. ............. 438/66 |
| 4,451,969 A * | 6/1984 | Chaudhuri ................... 438/62 |
| 4,478,879 A | 10/1984 | Baraona et al. ............... 427/85 |
| 4,838,952 A * | 6/1989 | Dill et al. ..................... 136/256 |
| 5,053,083 A * | 10/1991 | Sinton ........................ 136/256 |
| 5,067,985 A | 11/1991 | Carver et al. ............... 136/255 |
| 5,449,626 A * | 9/1995 | Hezel .......................... 438/71 |
| 5,591,565 A * | 1/1997 | Holdermann et al. ......... 438/98 |
| 5,641,362 A | 6/1997 | Meier ......................... 136/256 |
| 5,665,175 A | 9/1997 | Safir .......................... 136/255 |
| 5,665,607 A * | 9/1997 | Kawama et al. ............. 438/64 |
| 5,704,992 A | 1/1998 | Willeke et al. ............. 136/255 |
| 5,899,704 A * | 5/1999 | Schlosser et al. ............ 438/98 |
| 6,096,968 A * | 8/2000 | Schlosser et al. ........... 136/256 |

(Continued)

FOREIGN PATENT DOCUMENTS

| | | |
|---|---|---|
| DE | 19811878 | 9/1999 |
| DE | 10047556 | 4/2002 |
| EP | 0776051 | 5/1997 |
| EP | 0881694 | 12/1998 |
| EP | 881694 A1 * | 12/1998 |
| WO | 01/83391 | 11/2001 |
| WO | 02/23639 | 3/2002 |

OTHER PUBLICATIONS

Fahrenbruch et al, Fundamentals of Solar Cells, Academic Press, New York, (1983), pp. 269-271.*

(Continued)

*Primary Examiner*—Kishor Mayekar
(74) *Attorney, Agent, or Firm*—McGlew and Tuttle, P.C.

(57) ABSTRACT

A solar cell involving a silicon wafer having a basic doping, a light-receiving front side and a backside, which is provided with an interdigital semiconductor pattern, which interdigital semiconductor pattern has a first pattern of at least one first diffusion zone having a first doping and a second pattern of at least one second diffusion zone, separated from the first diffusion zone(s) and having a second doping that differs from the first doping, wherein each second diffusion zone is arranged along the sides of at least one groove extending from the backside into the silicon wafer.

10 Claims, 5 Drawing Sheets

U.S. PATENT DOCUMENTS

Figure 1:
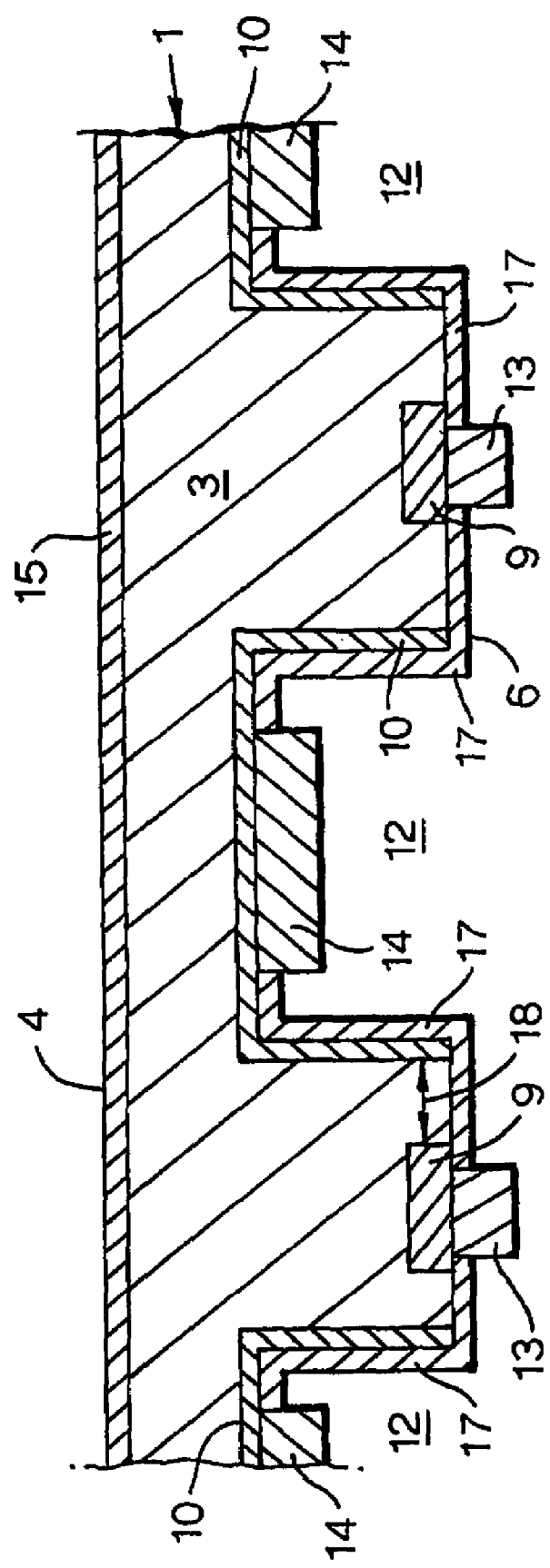
Figure 2:
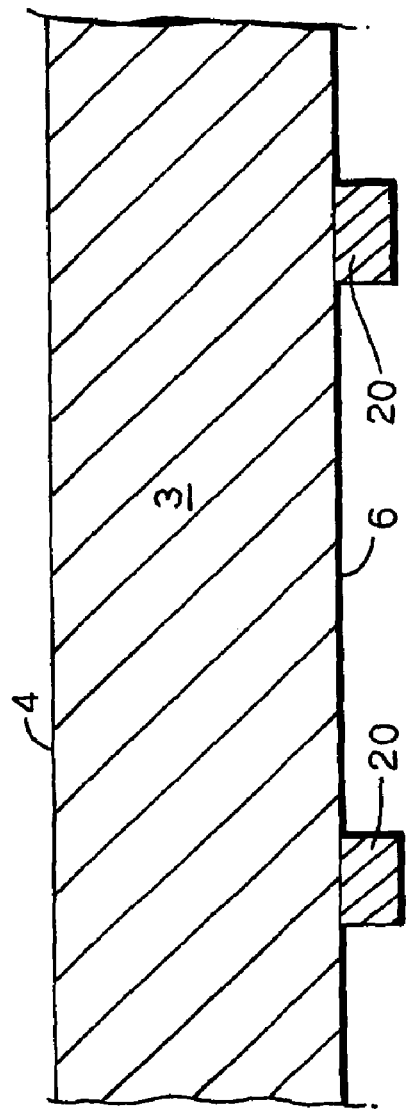

2004/0110393 A1* 6/2004 Munzer et al. ............. 438/778
2004/0187916 A1* 9/2004 Hezel ......................... 136/256
2004/0200520 A1* 10/2004 Mulligan et al. ........... 136/256

OTHER PUBLICATIONS

Hezel, "Novel Back Contact Silicon Solar Cells Designed for Very High Efficiencies and Low-Cost Mass Production," Conference Record of the 29th IEEE Photovoltaic Specialists Conference, pp. 114-117, May 19-24, 2002.*

Muller et al, "Self-Aligning, Industrially Feasible Back Contacted Silicon Solar Cells with Efficiencies >18%," Proceedings of the 3rd World Conference on Photovoltaic Energy Conversion, pp. 1403-1406, May 12-16, 2003.*

International Search Report dated Jul. 17, 2003.

Szlufcik, J., et al. Simple integral screen printing process for selective emitter poilycrystalline solar cells, In: Appl. Phys. Lett., ISSN 0003-6951, 1991, vol. 59, No. 13, S. 1583-1584.

* cited by examiner

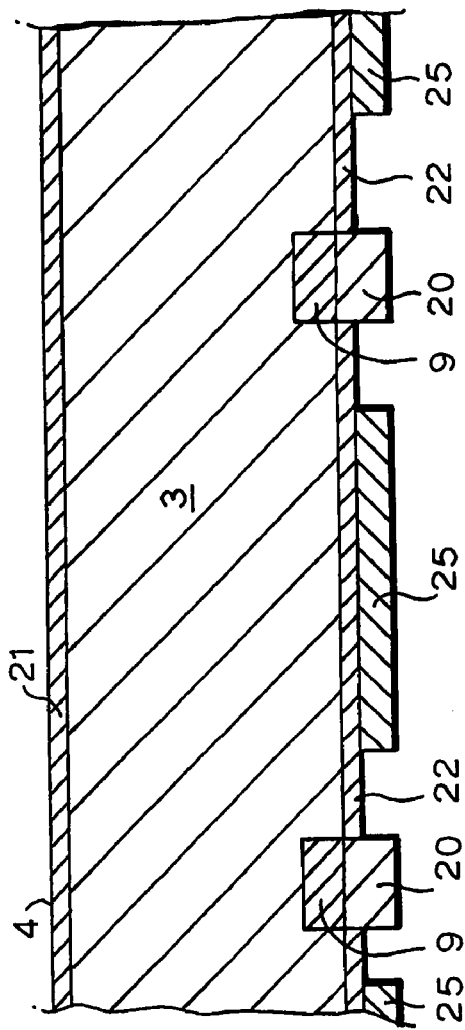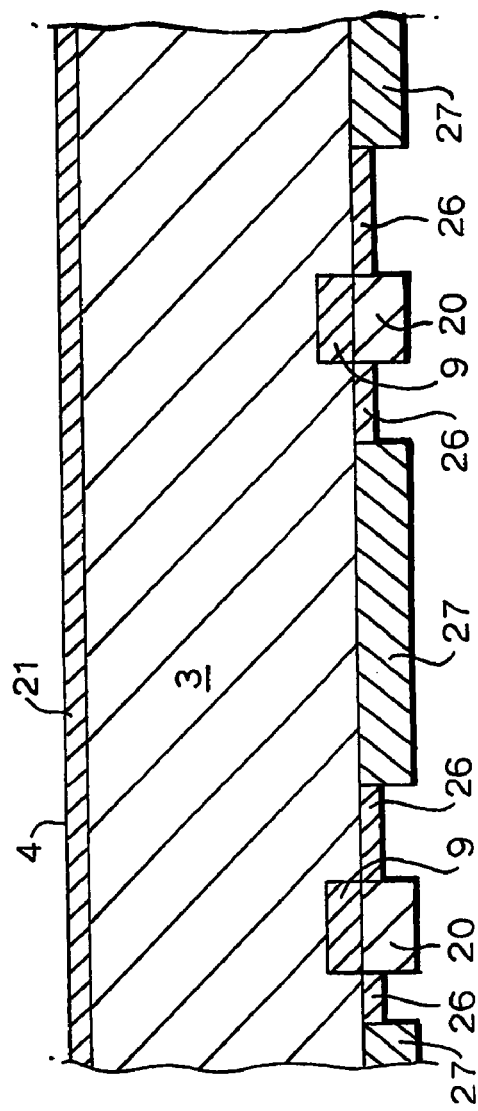

MANUFACTURING A SOLAR CELL WITH BACKSIDE CONTACTS

This application is a 35 U.S.C. 371 National Stage filing of PCT/EP02/13317 on Nov. 26, 2002.

The invention relates to a method of manufacturing a solar cell with backside contacts.

A solar cell comprises a silicon wafer having a light-receiving front side and a backside. The silicon wafer is provided with a basic doping, wherein the basic doping can be of the n-type or of the p-type. The solar cell is usually provided with metallic contacts on the light-receiving front side as well as on the backside to carry away the electric current produced by the solar cell. Especially the metal contacts on the light-receiving front side pose a problem in regard to the degree of efficiency, since the metal covering causes shading of the effective area of the solar cell. Although one optimises the metal covering so as to reduce the shading, a metal covering of approximately 10% remains unavoidable since the metallization has to occur in a manner that keeps the electrical losses small. For the metal contacts on the backside the danger of shading does not occur, however, for contacting an optimisation between the electrical losses and the costs for applying the metal contacts at the backside must be achieved.

There are solar cells where both contacts are provided on the backside of the solar cell, so that the solar cell is not shaded through the metal contacts. An example of such a cell is given in International patent application publication No. 02/23 639. However, manufacturing such solar cells with contacts only on the backside is very elaborate and it involves numerous masking, etching and cleaning process steps. Moreover, the metallization structures must be exactly aligned. The relatively large costs of manufacturing the solar cells with backside contacts have prevented large-scale implementation of these more efficient solar cells.

It is an object of the present invention to provide a solar cell with backside contacts that is mechanically strong and wherein recombination of charge carriers is reduced. It is a further object of the invention to provide a solar cell with backside contacts that, in comparison with the known cells, can be manufactured just as reliably but in a more cost-effective way.

The solar cell according to the present invention comprises a silicon wafer having a light-receiving front side and a backside, wherein the silicon wafer has a basic doping, and is, at its backside, provided with an interdigital semiconductor pattern, which interdigital semiconductor pattern comprises a first pattern of at least one first diffusion zone having a first doping and a second pattern of at least one second diffusion zone, separated from the first diffusion zone(s) and having a second doping that differs from the first doping, wherein each second diffusion zone is arranged along the sides of at least one groove extending from the backside into the silicon wafer.

To carry away the electric current produced by the solar cell, the interdigital semiconductor pattern is provided with an interdigital contacting structure.

The invention further relates to a method of manufacturing a solar cell, which method comprises providing a silicon wafer having a light-receiving front side and a backside with a basic doping, and providing the silicon wafer at its backside with an interdigital semiconductor pattern, wherein providing the interdigital semiconductor pattern comprises the steps of:

(a) applying to the backside a doping paste containing a first dopant to obtain a pattern of at least one area covered with doping paste;
(b) drying the doping paste;
(c) producing a pattern of at least one first diffusion zone having a first doping by forcing at elevated temperature in a free oxygen-containing atmosphere the first dopant to diffuse into the silicon wafer, and simultaneously producing a silicon oxide layer;
(d) etching part of the silicon oxide layer by applying a first etching agent in areas between the first diffusion zones, and removing the first etching agent and the etched silicon oxide layer to obtain a pattern of silicon oxide rims;
(e) etching part of the silicon wafer by applying a second etching agent between the silicon oxide rims, and removing the second etching agent and the etched silicon to obtain a pattern of at least one groove;
(f) producing a second diffusion zone having a second doping on the sides of each of the at least one groove, wherein the second doping differs from the first doping; and
(g) removing the doping paste and the remainder of the silicon oxide layer to obtain the interdigital semiconductor pattern.

To manufacture a solar cell wherein the electric current produced by the solar cell can be carried away, the method further comprises providing the interdigital semiconductor pattern with an interdigital contacting structure, which comprises applying a passivating layer on the surfaces of the silicon wafer and the diffusion zones; applying metallization layers on the passivating layer, wherein each metallization layer extends along a diffusion zone; and producing electric contacts by firing the metallization layers.

The invention allows for the structured creation of diffusion zones since the pastes can be applied to the silicon wafer of the solar cells through screen-printing. Thus, any structure necessary for the manufacturing of solar cells can be formed through a simple, reliably reproducible and cost-effective manner since through the structured application of pastes in a comparatively simple manner an exact alignment of the individual zones of the solar cell can be achieved.

Through the application of screen printable doping and/or etching pastes in manufacturing of diffusion zones in the silicon wafer of a solar cell, a solar cell with backside contacts can be manufactured in a simple and cost-effective manner. The designs of the screens that were used for producing the first diffusion zone(s) and for etching the silicon oxide layer can be used for the screens used to apply the metallization layers. Thus, the invention removes the economic disadvantages were related to the currently required process steps for the manufacturing of this type of solar cells.

Through a suitable coordination of the process steps an especially cost-effective way for the manufacturing of a solar cell with backside contacts can be found.

The invention will now be described in more detail by way of example on the basis of this exemplary embodiment with reference to the Figures in which:

FIG. 1 shows schematically and not to scale part of a cross-section of a solar cell according to the present invention; and FIGS. 2 through 8 show schematically steps of the process of manufacturing the solar cell according to the present invention.

Reference is now made to FIG. 1 showing schematically and not to scale part of a cross-section of a solar cell 1 according to the present invention.

The solar cell 1 comprises a silicon wafer 3 having a light-receiving front side 4 and a backside 6. The silicon wafer 3 has a basic doping, which is in this case a p-type doping.

At the backside 6, the silicon wafer 3 is provided with an interdigital semiconductor pattern that comprises a first pattern of at least one first diffusion zone 9 having a first doping, and a second pattern of at least one second diffusion zone 10. The second diffusion zones 10 are separated from the first diffusion zones 9, and they have a second doping that differs from the first doping. Each second diffusion zone 10 is arranged along the sides of at least one groove 12 extending from the backside 6 into the silicon wafer 3. Suitably the number of grooves is in the range of from 1 to 100 grooves per centimetre width of the wafer, and the width of a groove is suitable in the range of from 0.05 to 5 millimetre, and the width of the rim between adjacent grooves is also in the range of from 0.05 to 5 millimetre. Suitably the grooves are parallel to each other.

Suitably, the interdigital semiconductor pattern is provided with an interdigital contacting structure, wherein the first diffusion zones 9 are provided with a first contacting structure 13, and the second diffusion zones 10 are provided with a second contacting structure 14 to allow carrying away the electric current produced by the solar cell during normal operation. The interdigital contacting structure forms the backside contacts.

Suitably, the first doping of the first diffusion zones 9 is of the same type as the basic doping of the silicon wafer 3. Consequently, the doping of the second diffusion zones 10 differs from the basic doping.

An advantage of the solar cell according to the present invention is that the thickness of the silicon wafer 3 at the location of the grooves 12 (the thin wafer section) is smaller than the original thickness of the silicon wafer 3 at the location of the first diffusion zones 9. Thus at the location of the second diffusion zones 10, which suitably have a doping that is different from the basic doping the thickness is small, which reduces the possibilities for recombination of carriers. And the thickness at the location of the first diffusion zones is large to provide mechanical strength to the solar cell 1 of the present invention.

The grooves 12 extend into the silicon wafer 3 so as to form a thin wafer section, wherein the thickness of the thin-wafer section is suitably between 30 to 60% of the thickness of the silicon wafer 3 or in the range of between 50 and 150 micrometre, whichever is the smallest.

The front side 4 is suitably provided with an anti-reflection coating 15 and the backside, between the contacting structures 13 and 14 is provided with an anti-reflection coating 17. The anti-reflection coatings 15 and 17 also serve to passivate the surface of the silicon wafer 3. Suitable materials for the anti-reflection coating are silicon oxide and silicon nitride or a mixture of silicon oxide and silicon nitride.

To provide sufficient electrical insulation between the diffusion zones of different types, the size of the separation 18 between a first and a second diffusion zone 9 and 10 is suitably greater than the thickness of the second diffusion zone 10, and suitably greater than the sum of the thicknesses of the first and second diffusion zones 9 and 10.

The method of manufacturing a solar cell according to the present invention will now be discussed with reference to FIGS. 2 through 8. Features already discussed with reference to FIG. 1 will get the same reference numerals.

As with other manufacturing processes, the starting point for the manufacturing of a solar cell with backside contacts according to the invention is a sawn silicon wafer 3 with a suitable p-type or n-type basic doping. The thickness of the silicon wafer 3 can be freely chosen depending on the solar cell design. The surface layer can be damaged by the sawing step, and this damage is removed by etching. Depending on the solar cell design, additional preparatory process steps may follow, for example a process step in which the silicon wafer 3 undergoes texture etching as described in German patent application publication No. 198 11 878.

The silicon wafer 3 has a light-receiving front side 4 and a backside 6. The first step of providing the backside 6 of the silicon wafer 3 with an interdigital semiconductor pattern comprises applying to the backside 6 a doping paste 20 containing a first dopant to obtain a pattern of at least one area covered with doping paste 20 (see FIG. 2). The doping paste 20 is suitably applied by means of screen-printing.

Subsequently the doping paste 20 is dried.

Figure 3:
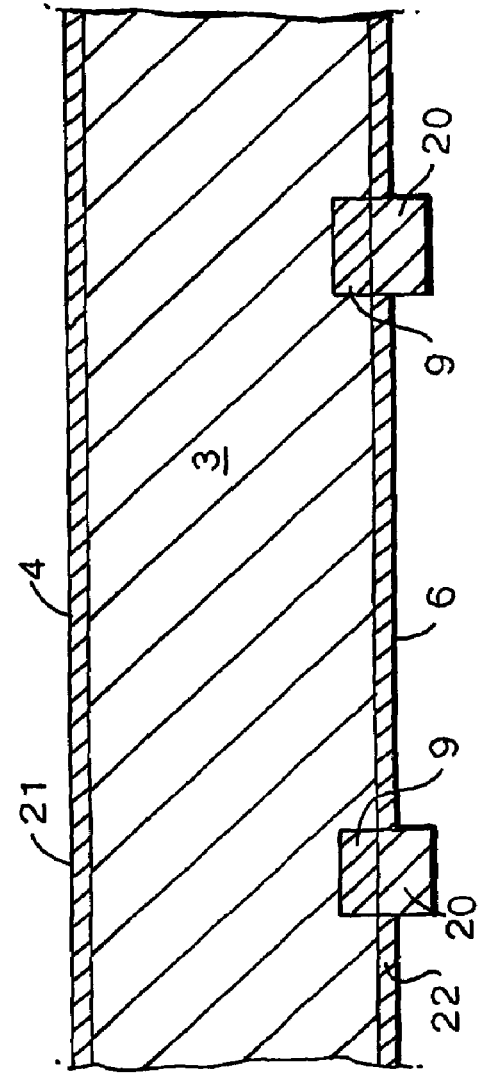

Reference is now made to FIG. 3. The next step is producing a pattern of at least one first diffusion zone 9 having a first doping by forcing at elevated temperature in a free oxygen-containing atmosphere the first dopant to diffuse from the doing paste 20 into the silicon wafer 3, and simultaneously producing silicon oxide layers 21 and 22 at the light-receiving front side 4 and the backside 6.

The first dopant can be boron, aluminium, gallium, or indium to obtain p-doped first diffusion zones 9, or phosphorus, arsenic or antimony to obtain n-doped first diffusion zones 9. The elevated temperature is suitably between 800° C. and 1200° C. (for example between 900° C. and 1200° C. when the dopant is boron, and between 800° C. and 1000° C. when the dopant is phosphorus).

The next step is shown in FIG. 4. This step comprises etching part of the silicon oxide layer 22 by applying an etching agent 25 in areas between the first diffusion zones 9, and removing the etching agent 25 and the etched silicon to obtain a pattern of silicon oxide rims 26. The etching agent is suitably an etching paste that is applied by means of screen-printing, wherein the active ingredient is an aqueous acidic solution.

The silicon oxide rims 26 are now used as a mask for producing the grooves 12 (see FIG. 1) as will be explained with reference to FIG. 5. Between the silicon oxide rims 26, a second etching agent 27 is applied. When the etching has reached the required depth, the second etching agent and the etched-away parts of the silicon wafer 3 are removed to obtain the pattern of at least one groove 12. The etching agent is suitably an aqueous alkaline solution that is so selected that silicon oxide is not etched away.

Figure 6:
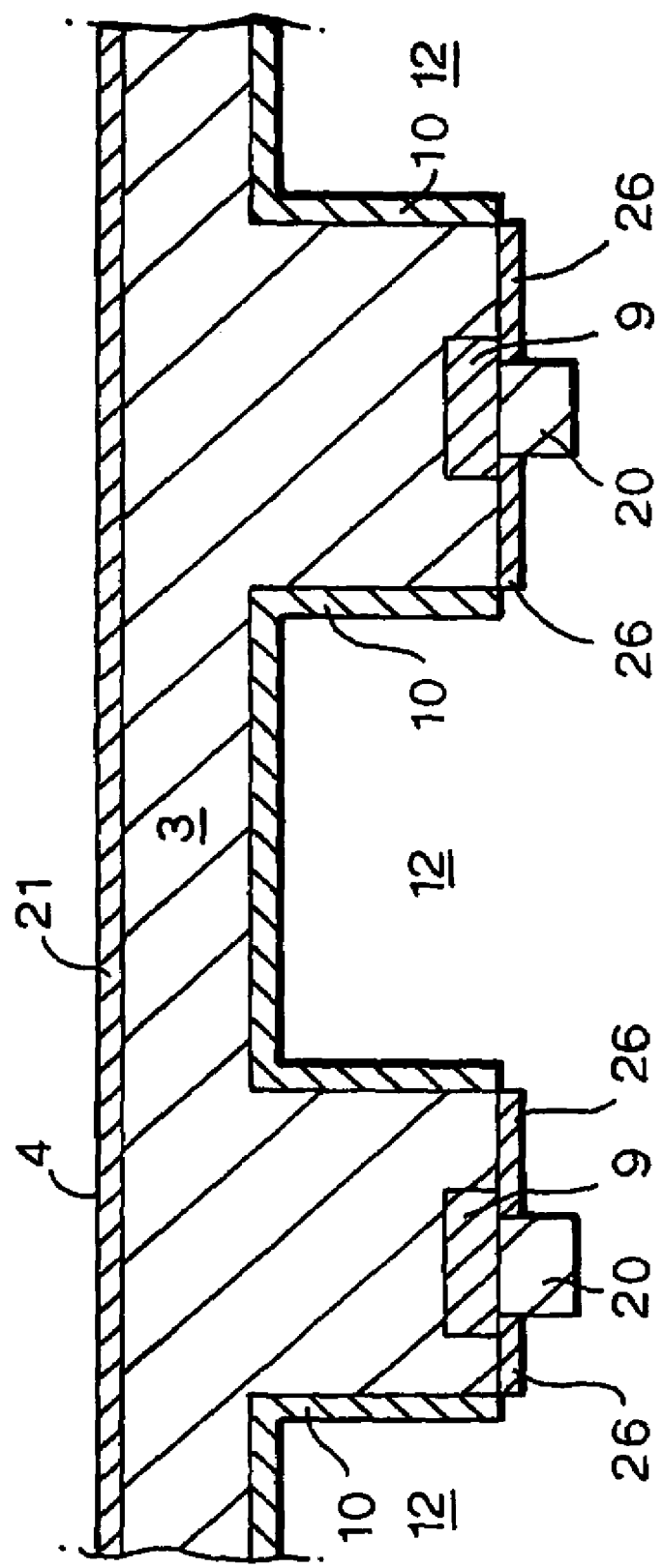

Reference is now made to FIG. 6, showing the result of the next step. This step involves producing second diffusion zones 10 having a second doping on the sides of each of the at least one groove 12, wherein the second doping differs from the first doping. Because the etching agent in the previous step was applied between the first diffusion zones 9, after removing the etching agent, rims 26 of silicon oxide remain, and these rims are responsible for the separation 18 (see FIG. 1) between the first and second diffusion zones 9 and 10. The rims 26 are protective zones, which form a mask for the diffusion of the second doping.

Suitably, the diffusion of the second dopant is done from a gaseous phase, the dopant can be phosphorous or boron.

Figure 7:
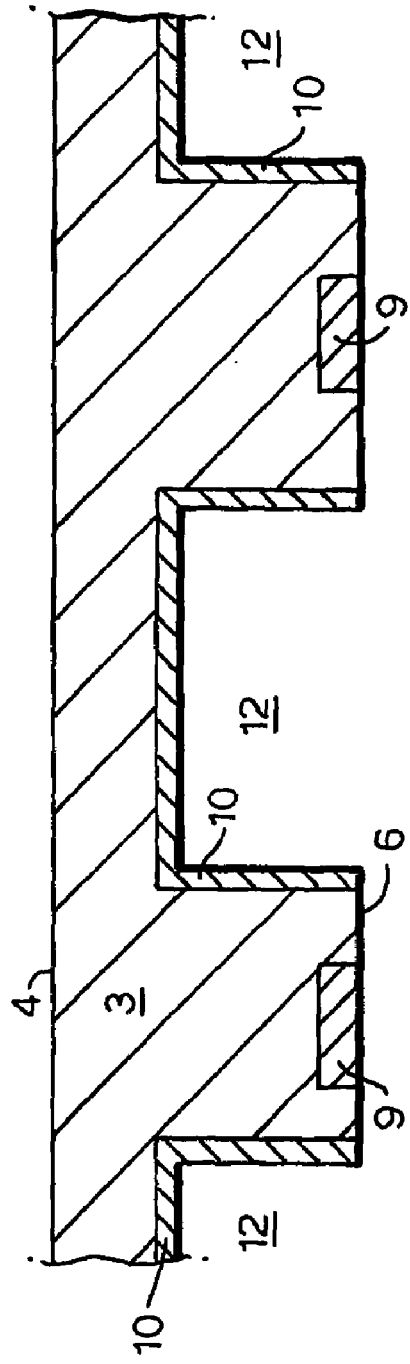

The last step of the method according to the present invention is removing the doping paste 20 and the rims 26 of the silicon oxide layer to obtain the interdigital semiconductor pattern 9, 10 at the backside 6 of the silicon wafer 3. A suitable etching agent to remove the doping paste 20 and the rims 26 is diluted hydrofluoric acid. The result is shown in FIG. 7.

The interdigital semiconductor pattern comprises the first pattern first diffusion zones 9 having a first doping, and the second pattern second diffusion zones 10 arranged along the sides of the grooves 12. The second diffusion zones 10 are separated from the first diffusion zones 9, and they have a second doping that differs from the first doping. An advantage of the process according to the invention that the etching step is carried out such that edge isolation between the diffusion zones 9 and 10 is created automatically so that an additional edge isolation step necessary for this, for example, through plasma etching, can be omitted.

In order to carry away the electric current produced during normal operation of the solar cell, metal contacts are applied on the interdigital semiconductor pattern. Prior to this step, the surfaces of the silicon wafer 3 can be passivated by applying a suitable anti-reflection coating that serves as well as a passivation layer, such as silicon nitride, silicon oxide or a mixture of silicon nitride and silicon oxide.

Figure 8:
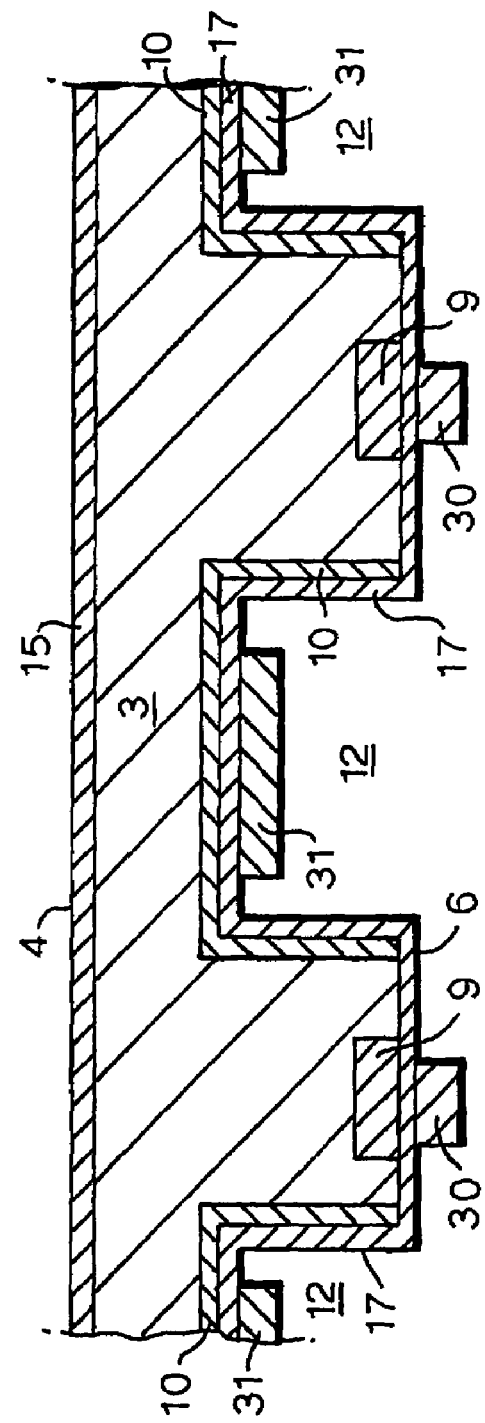

The surfaces 4 and 6 are provided with a silicon oxide anti-reflection coating 15 and 17 (see FIG. 8).

Then metallization layers 30 and 31 are applied on the anti-reflection coating 17 that is applied on the back surface 6, wherein each metallization layer 30 and 31 extends along a diffusion zone 9 and 10. Subsequently the electric contacts 13 and 14 (see FIG. 1) are obtained by firing the metallization layers 30 and 31. The paste used for the metallization layers can be doped or free from dopant. Suitably the paste is free from dopant, because the diffusion zones already provide the ohmic contact. Using a paste that is free from dopant has the additional advantage that the same paste is used for the two metallization layers 30 and 31.

The metallization layers 30 are suitable applied by means of screen-printing using screens of the same design as the screens that were used to apply the doping paste 20. And the metallization layers 31 are suitably applied by means of screen-printing using screens of the same design as the screens that were applied to apply the etching agent 25 (see FIG. 4). In this way the areas later forming the electric contacts 13 and 14 can be easily aligned with the diffusion zones 9 and 10.

Alternatively the designs of the screens used to print the metallization layers 30 and 31 can be combined into one so that both metallization layers can be screen-printed in one step. In this case the different contacts are already aligned with respect to each other and therefore there are no problems with cross-contacting or cross-contamination. The metallization paste used in the alternative process is free from dopant, so that the same paste is used for both metallization layers 30 and 31.

The basic doping of the silicon wafer can be a p-type or an n-type, the doping of the first diffusion zones 9 can be a p-type or an n-type, and the doping of the second diffusion zones 10 is then either an n-type or a p-type.

Suitably, the doping of the first diffusion zone is the same as the basic doping, so as to form first diffusion zones 9 having a larger concentration of the carriers pertaining to the doping than the silicon wafer 3. Such a concentration difference of carriers of the same kind is referred to as a back surface field, which is in the solar cell according to the present invention a local back surface field, because it is not continuous along the backside 6. In this case, the doping of the second diffusion zones 10 differs from the basic doping and a p-n or an n-p junction is formed at the interfaces.

Depending on the design of the solar cell and its application, different concentrations and penetration depths of the dopant in the diffusion zones 9 and 10 can be specified.

Because of the already existing high doping in the diffusion zones 9 and 10, an un-doped paste, for example an un-doped silver paste, can be used for the two metal contacts 13 and 14. However, in case of different or insufficient doping, doped metallization pastes can be used that have been adjusted for the contacting of the respective areas.

The individual solar cells manufactured according to the present invention can be integrated to form a solar module. To this end the backside contacts of neighbouring cells are joined by suitable bonding material to form a series connection or a parallel connection.

I claim:

1. A method of manufacturing a solar cell, which method comprises providing a silicon wafer having a light-receiving front side and a backside with a basic doping, and providing the silicon wafer at its backside with an interdigital semiconductor pattern, wherein providing the interdigital semiconductor pattern comprises the steps of:
  (a) applying to the backside a doping paste containing a first dopant to obtain a pattern of at least one area covered with doping paste;
  (b) drying the doping paste;
  (c) producing a pattern of at least one first diffusion zone having a first doping by forcing at elevated temperature in a free oxygen-containing atmosphere the first dopant to diffuse into the silicon wafer, and simultaneously producing a silicon oxide layer;
  (d) etching part of the silicon oxide layer by applying a first etching agent in areas between the first diffusion zones, and removing the first etching agent and the etched silicon oxide layer to obtain a pattern of silicon oxide rims;
  (e) etching part of the silicon wafer by applying a second etching agent between the silicon oxide rims, and removing the second etching agent and the etched silicon to obtain a pattern of at least one groove;
  (f) producing a second diffusion zone having a second doping on the sides of each of the at least one groove, wherein the second doping differs from the first doping; and
  (g) removing the doping paste and the remainder of the silicon oxide layer to obtain the interdigital semiconductor pattern.

2. The method according to claim 1, which method further comprises providing the interdigital semiconductor pattern with an interdigital contacting structure, which comprises applying a passivating layer on the surfaces of the silicon wafer and the diffusion zones; applying metallization layers on the passivating layer, wherein each metallization layer extends along a diffusion zone; and producing electric contacts by firing the metallization layers.

3. The method according to claim 1, wherein the doping paste in step (a) is applied by means of screen-printing.

4. The method according to claim 1, wherein the etching agent is an etching paste, which is applied by means of screen printing.

5. The method according to claim 1, wherein forcing the dopant to diffuse into the silicon wafer in step (c) is carried out at a temperature in the range of from 800° C. to 1200° C.

6. A solar cell comprising a silicon wafer having a light-receiving front side and a backside, wherein the silicon wafer has a basic doping, and is, at its backside, provided with an interdigital semiconductor pattern, which interdigital semiconductor pattern comprises a first pattern of at least one first diffusion zone having a first doping and a second pattern of at least one second diffusion zone, separated from the first diffusion zone(s) and having a second doping that differs from the first doping, wherein each second diffusion zone is arranged along the sides of at least one groove extending from the backside into the silicon wafer and wherein the thickness of the silicon wafer at the location of the at least one groove is smaller than the thickness of the silicon wafer at the location of the at least one first diffusion zone, wherein the at least one groove is located in an area separated from the first pattern of the at least one first diffusion zone.

7. The solar cell according to claim 6, wherein the interdigital semiconductor pattern is provided with an interdigital contacting structure.

8. The solar cell according to claim 6, wherein the first doping is of the same type as the basic doping.

9. The solar cell according to claim 6, wherein the size of the separation between the first at least one and the second at least one diffusion zone is greater than the thickness of the second diffusion zone.

10. The solar cell according to claim 9, wherein the size of the separation between the first at least one and the second at least one diffusion zone is greater than the sum of the thicknesses of the first and second diffusion zones.

* * * * *